(12) United States Patent
Pyarali Bandali et al.

(10) Patent No.: US 12,248,017 B1
(45) Date of Patent: Mar. 11, 2025

(54) ARC FAULT CURRENT HEALTH CHECK CIRCUIT

(71) Applicant: Lunar Energy, Inc., Mountain View, CA (US)

(72) Inventors: Maisam Gulamabbas Pyarali Bandali, Palo Alto, CA (US); Hai-Yue Han, San Jose, CA (US)

(73) Assignee: Lunar Energy, Inc., Mountain View, CA (US)

( * ) Notice: Subject to any disclaimer, the term of this patent is extended or adjusted under 35 U.S.C. 154(b) by 0 days.

(21) Appl. No.: 18/775,913

(22) Filed: Jul. 17, 2024

(51) Int. Cl.
*H02S 50/00* (2014.01)
*G01R 19/00* (2006.01)
*G01R 31/28* (2006.01)

(52) U.S. Cl.
CPC ..... *G01R 31/2841* (2013.01); *G01R 19/0092* (2013.01); *H02S 50/00* (2013.01)

(58) Field of Classification Search
CPC .. G01R 31/2841; G01R 19/0092; H02S 50/00
See application file for complete search history.

(56) References Cited

U.S. PATENT DOCUMENTS

| | | | | |
|---|---|---|---|---|
| 2004/0263183 | A1* | 12/2004 | Naidu | G01R 31/52 324/536 |
| 2018/0358797 | A1* | 12/2018 | Chaintreuil | H02H 1/0015 |
| 2024/0313521 | A1* | 9/2024 | Somers | H02H 1/0015 |

* cited by examiner

*Primary Examiner* — Jermele M Hollington
*Assistant Examiner* — Haidong Zhang
(74) *Attorney, Agent, or Firm* — Van Pelt, Yi & James LLP

(57) ABSTRACT

An AC power source is controlled to inject an AC signal to a current sensor. In one embodiment, the AC power source is capacitively coupled to the current sensor. An output of an arc fault detection circuit is received. In one embodiment, the arc fault detection circuit is coupled to the current sensor, and wherein the arc fault detection circuit is configured to detect a presence of an arc based at least in part on the current sensor. It is determined whether a fault in the arc fault detection circuit is present based at least in part on an evaluation of the output of the arc fault detection circuit.

19 Claims, 10 Drawing Sheets

ARC FAULT CURRENT HEALTH CHECK CIRCUIT

BACKGROUND OF THE INVENTION

An arc fault is a type of electrical failure that most commonly occurs when an air gap is introduced between two conducting elements, which may lead to electrical current arcing across the contacts and creating a ball of plasma. This generates a high amount of light and heat and presents a safety hazard due to risk of fire.

In public and/or private engineered systems, arc faults are detected and/or interrupted as a safety requirement from regulators and/or owners. An efficient assurance of this arc fault safety requirement is an improvement.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A circuit health checker for isolated circuits is disclosed. In one embodiment, the isolated circuits are between a first domain and a second domain. In one embodiment, the first domain circuits include a sensor and the second domain circuits include an evaluator.

Figure 1A:
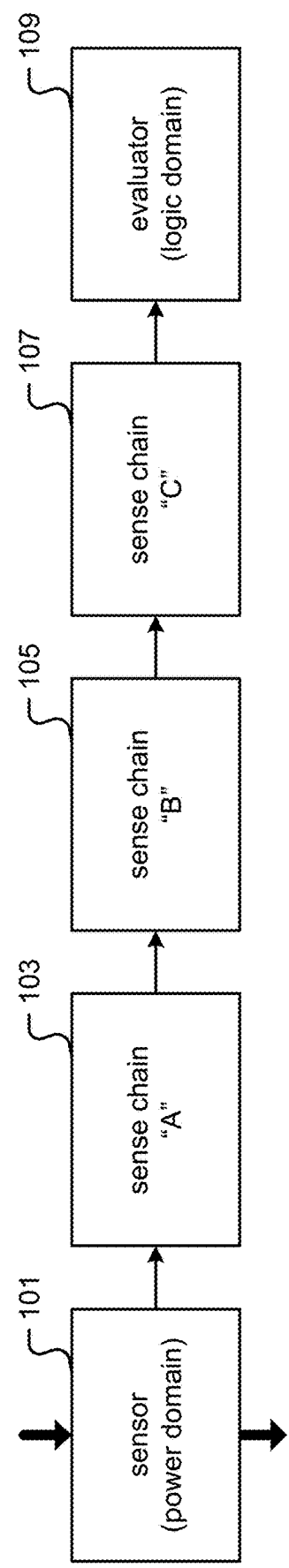
FIG. 1A is a block diagram illustrating an embodiment of a condition sensor and evaluator for isolated circuits.

FIG. 1A is a block diagram illustrating an embodiment of a condition sensor and evaluator for isolated circuits. In a first domain a component (101) is used to sense or measure a condition. In one embodiment, this first domain component (101) is a sensor (101), for example, a current sensor in a power domain (101). A power domain as referred to herein is a domain of higher voltage AC/DC circuits including components like relays, power electronics, inverters, and/or rectifiers. In one embodiment, the condition being sensed or measured may include a safety condition with regulatory requirements, for example, an arc fault condition. In FIG. 1A, thick black arrows at the sensor (101) are used to indicate it is part of a system, and may be in series and/or parallel with active components in the system. For example, a current sensor in the power domain (101) may be used to measure instantaneous current draw in the system. This in turn may be used for control purposes, for example, for a solar photovoltaic (PV) system the sensor may be a current sensor to sense how much current a PV system is producing from the sun and/or how much energy a household with solar panels is receiving from the sun.

In order to adapt the sensor (101) output for evaluation of a condition, one or more components may be used to condition the signal from the sensor (101). As referred to herein, a sense chain is a chain of components in series and/or in parallel that condition the signal from the sensor (101) for evaluation of the condition. In FIG. 1A, without limitation and for the purposes of illustration, three components titled sense chain "A" (103), sense chain "B" (105), and sense chain "C" (107) are coupled in series. For example, sense chain "A" (103) may be an amplification stage, sense chain "B" (105) may be a low pass filter stage, and sense chain "C" (107) may be a high pass filter stage. In one embodiment, the sense chain is in the first domain, for example, a power domain. In one embodiment, the sense chain is in the second domain, for example, a logic domain.

In a second domain a component (109) is used to evaluate the condition that was sensed or measured by component (101). In one embodiment, this second domain component (109) is an evaluator (109), for example, a microcontroller in a logic domain (109). A logic domain as referred to herein is a domain of logic family circuits, for example, ECL, TTL, CMOS and/or BiCMOS family components, and/or integrated circuit logic. In one embodiment, the condition being evaluated may include a safety condition with regulatory requirements, for example, an arc fault condition.

In FIG. 1A, the sensor (101) in the power domain, the sense chain (103), (105), (107) in either the power domain or the logic domain, and the evaluator (109) in the logic domain comprise a condition sensor and evaluator. If none of the sensor (101), sense chain (103), (105), (107), and/or evaluator (109) have one or more faults themselves, they may detect a condition. For safety conditions and/or conditions with regulatory oversight, a condition sensor and evaluator as shown in FIG. 1A may be insufficient to fulfil regulatory requirements because the circuit itself may have faults.

Figure 1B:
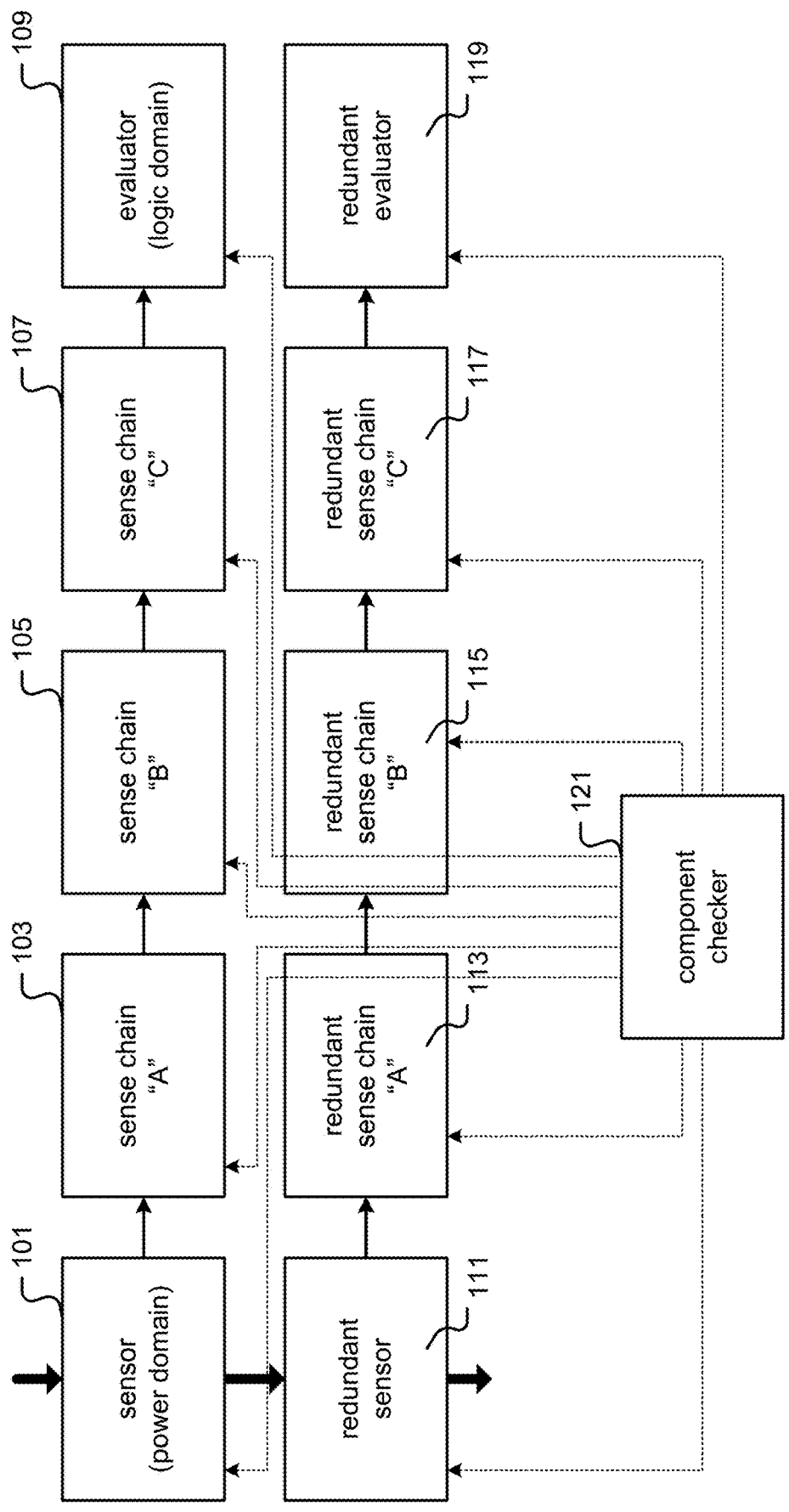
FIG. 1B is a block diagram illustrating a traditional embodiment of a one fault tolerant condition sensor and evaluator for isolated circuits.

FIG. 1B is a block diagram illustrating a traditional embodiment of a one fault tolerant condition sensor and evaluator for isolated circuits. In one embodiment, the condition sensor and evaluator of FIG. 1A is shown in FIG. 1B to be one fault tolerant, referred to herein as an ability to continue operating nominally/tolerant of a single fault when one of the components fails in the condition sensor and evaluator for isolated circuits.

As shown in FIG. 1B, the condition sensor and evaluator circuit is similar to that of FIG. 1A: the sensor (101) in the power domain; the sense chain (103), (105), (107) in either the power domain or the logic domain; and the evaluator (109) in the logic domain. To be one fault tolerant a set of redundant components including a redundant sensor (111), a redundant sense chain (113), (115), (117), and a redundant evaluator (119) is used in case one of the components fails. In this traditional approach, a component checker (121) is used to evaluate each of the components in the condition sensor and evaluator circuit, sensor (101), sense chain (103), (105), (107), and evaluator (109), along with the redundant circuit, sensor (111), sense chain (113), (115), (117), and evaluator (119). In the event a single fault occurs in any component, the component checker (121) may control the condition sensing and evaluation to go through the circuit path (101)-(109) or (111)-(119) that is without fault, thus achieving one fault tolerance. The component checker (121) may also check for a mismatch in the parallel circuit outputs to determine if a fault has occurred.

Figure 1C:
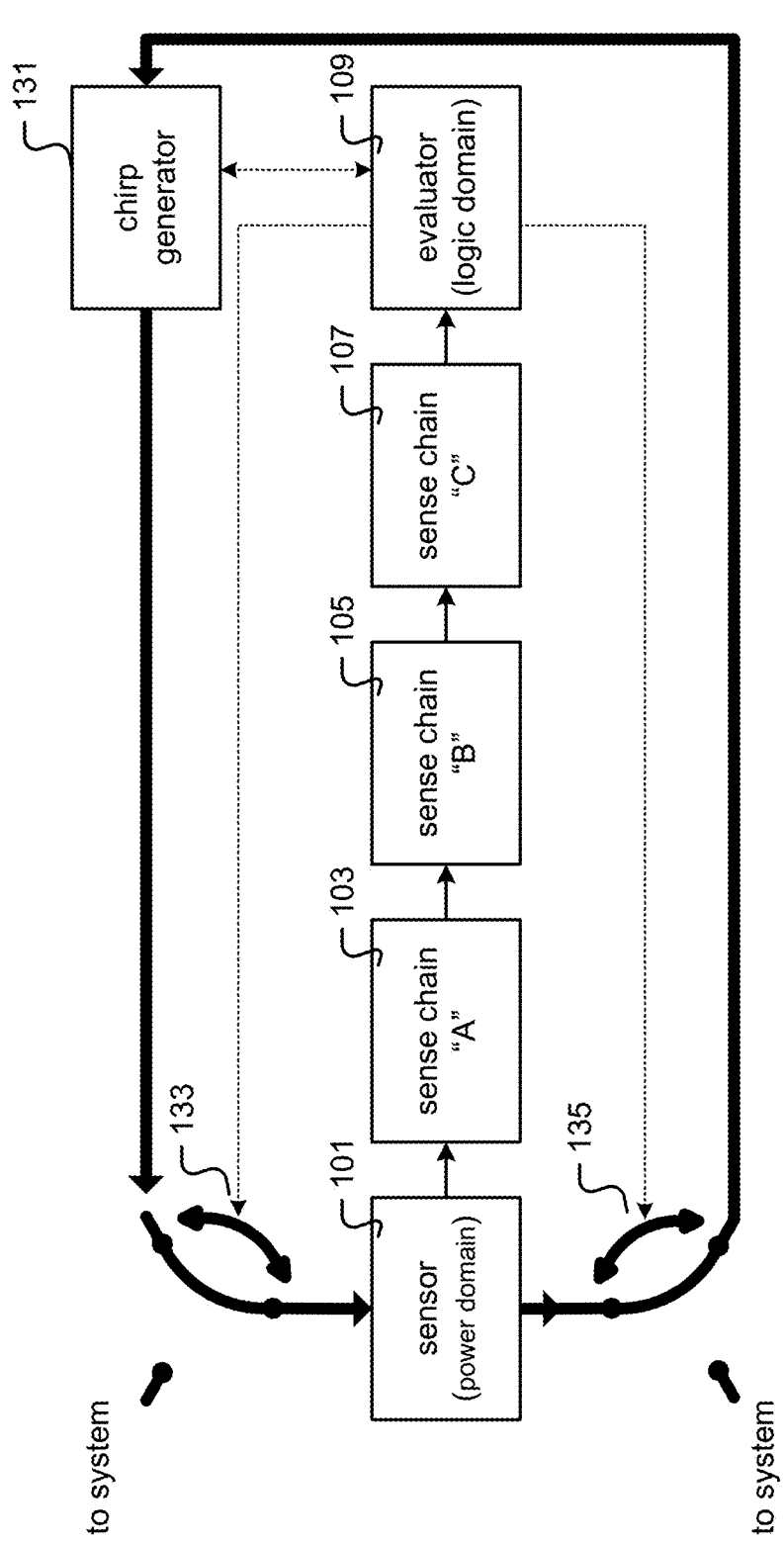
FIG. 1C is a block diagram illustrating an embodiment of a condition sensor and evaluator for isolated circuits using a one fault periodic circuit checker.

FIG. 1C is a block diagram illustrating an embodiment of a condition sensor and evaluator for isolated circuits using a one fault periodic circuit checker. In one embodiment, the condition sensor and evaluator of FIG. 1A is shown in FIG. 1C to be "one fault," referred to herein as an ability to detect one or more faults when one or more of the components fail in the condition sensor and evaluator for isolated circuits. In one embodiment, when a fault is detected in the condition sensor and evaluator, the system goes into a risk-addressed state, referred to herein as an error thrown state wherein the error cannot be resolved without external intervention. For example, for a PV generator at a household, if the arc fault condition sensor and evaluator is detected to have failed, a PV installer and/or technician would be required to travel and physically inspect the circuit before proceeding.

As shown in FIG. 1C, the condition sensor and evaluator circuit is similar to that of FIG. 1A: the sensor (101) in the power domain; the sense chain (103), (105), (107) in either the power domain or the logic domain; and the evaluator (109) in the logic domain. The evaluator (109) is also coupled to a chirp generator (131). As referred to herein, a chirp is a signal that provides assurance that a condition sensor and evaluator circuit is operating without a fault, and a chirp generator is a circuit that generates a chirp. For example, for a PV arc fault which typically exhibits power spectral elements in a band of frequencies between 1 kHz and 250 kHz, a chirp may be a 250 kHz signal. For example, for a 250 kHz chirp, a push-pull transformer driver in the logic domain may be used as a chirp generator (131).

The evaluator (109) is also coupled to a set of switches/relays (133), (135) that periodically switch the sensor (101) away from the nominal system input and instead take input from the chirp generator (131). For example, for a current sensor (101) such as a shunt resistor (101) in series with a PV DC generator, the switches/relays (133), (135) would switch the sensor from the solar panels and instead receive signal from the chirp generator (131).

Periodically then, the evaluator (109) switches the sensor (101) to the chirp generator (131), and evaluates the condition sensor and evaluator using the chirp. If the evaluation of the output of the condition sensor and evaluator is nominal, this indicates no fault in the condition sensor and evaluator circuit. For example, for an arc fault sensor in PV generation, if the chirp mimics an arc fault signature and the evaluator determines an arc fault occurs, this is considered nominal. If the evaluation of the output of the condition sensor and evaluator is abnormal, this indicates one or more faults in the condition sensor and evaluator circuit, but does not particularly indicate which component(s) are at fault. For example, for an arc fault sensor in PV generation, if the chirp mimics an arc fault signature and the evaluator does not determine an arc fault occurs, this is considered abnormal.

While the circuit in FIG. 1C is not one fault tolerant, the circuit complies with regulatory requirements in applications such as PV generation. Furthermore, for arc faults, the likelihood is low that a detection of an arc fault would be a false positive due to the nature of the arc fault and its characteristic behavior in the circuit. Thus, if an error is detected, either in an arc fault or a failure of the arc fault detection circuit, both are important enough from a regulation perspective that the system must be shut down to a safe state and proceeds only after a human checks it physically.

Redundancy/Correction versus Periodic/Detection. In one embodiment, an isolated push-pull transformer driver is used for a circuit health checker. In circuits that need to fail safe and/or that need to be detected in the event of failure, traditionally there may be an over-engineering of redundancies in order to meet safety/reliability requirements as shown in FIG. 1B. Examples of over-engineering include multiple resistors being added in parallel, capacitors being added in series, and/or entire circuits being duplicated and/or used in parallel. Such over-engineering may add to the bill of materials (BOM) cost, for example, between $5-$15 per unit in some applications. For products manufactured in the 100,000s or millions, these additional resources for a BOM may be significant economically and/or environmentally. Additionally, redundant measures may be incapable of detecting failure, especially in the event that a component checker (121) fails, as they may only provide an alternate functional channel in the event of failure of the primary circuit. Furthermore, redundant measures add complexity to a circuit which may introduce additional possibility of failure. Thus, improvements of a circuit health checker with less over-engineering include: a reduction in economical and/or environmental resources for building redundant circuits; and/or a reduction in electrical and/or thermal resources for operating redundant circuits.

An alternate approach is a failed circuit checker as shown in FIG. 1C that meets functional safety design requirements with lower BOM costs and/or less circuitry/complexity. A failed circuit checker may be used to detect the health of an arc fault current circuit, for example. In one embodiment, a chirp signal is injected at the source and at the end of a monitored circuit chain the output is measured. If the output is within a set of defined limits, the downstream circuits are determined to work. In one embodiment, a push-pull transformer driver is used by connecting it to a transformer and connecting the secondary windings across a current sense shunt resistor. Periodically, for example every 24 hours, an AC current is applied across the shunt resistor by the push-pull driver and the signal is propagated through the sense chain to test its amplifiers, filters, analog front end integrated circuits (ICs), and other components in the chain. If the output measured waveform is distorted, a failed test is declared indicating possible failure of one or more components in the chain. In a solar PV setting, the periodic test may occur at night when there is no sun to generate PV power.

Figure 1D:
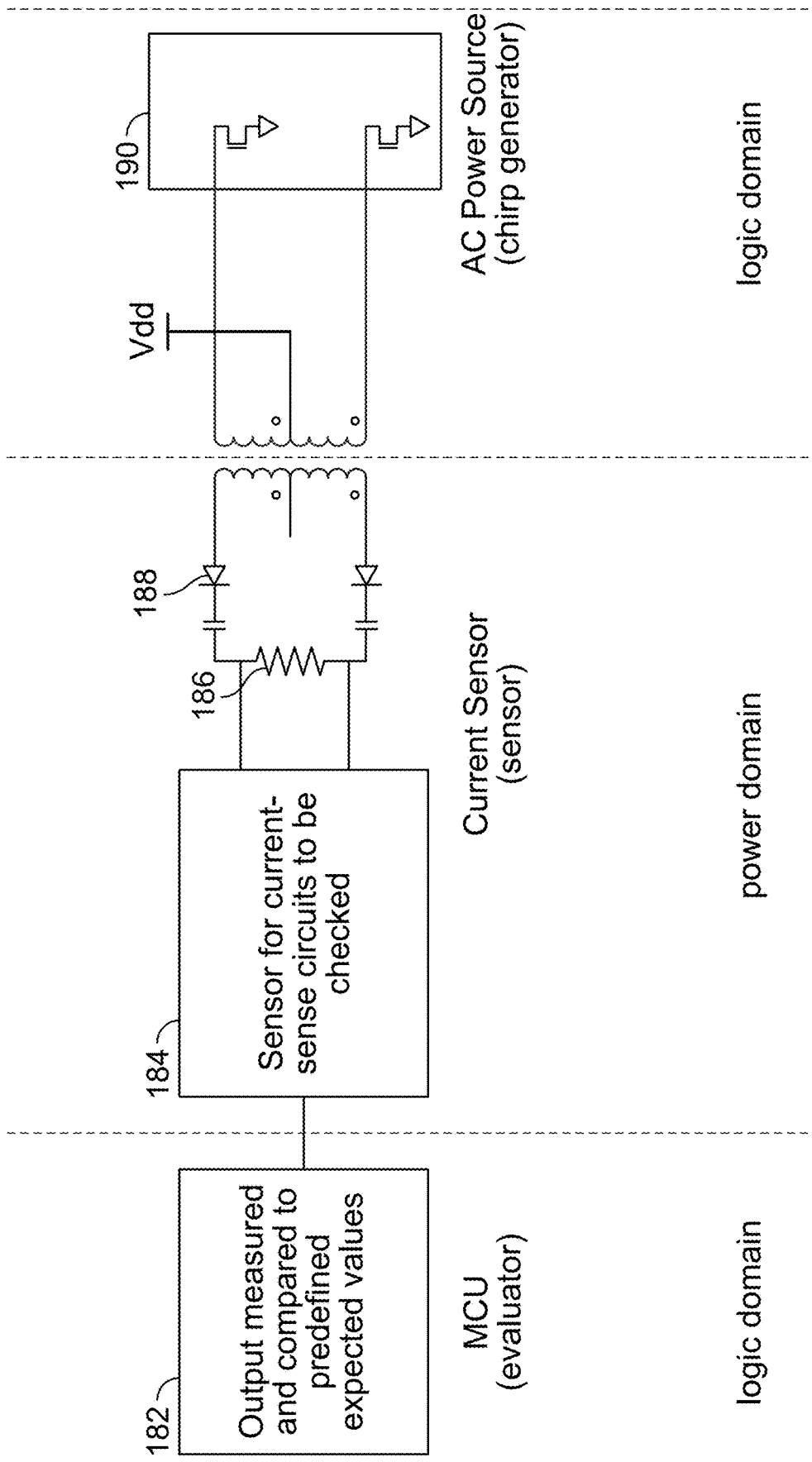
FIG. 1D is a block diagram illustrating an embodiment of a failed circuit checker.

FIG. 1D is a block diagram illustrating an embodiment of a failed circuit checker. A controller (182) such as a micro controller unit (MCU) is coupled to a current sensor (184). An example of a current sensor (184) is a shunt resistor (186). The current sensor (186) is coupled to an isolated current sense circuit (188) such as an arc fault detection circuit. The isolated current sense circuit (188) is capacitively coupled to an alternating current (AC) power source (190) such as an isolated push-pull transformer driver. The AC power source (190) drives the circuit and output of the current sensor (184) is measured and compared to pre-defined expected values to determine whether the isolated current sense circuit (188) has failed.

Arc Fault Current Interruption (AFCI). As described above, an arc fault is a type of electrical failure that most commonly occurs when an air gap is introduced between two conducting elements and presents a safety hazard due to risk of fire. One domain where an arc fault may be more likely is in solar/PV circuitry, for example, standard PV strings generate relatively constant current, with small amounts of high frequency ripple. An arc fault may happen if copper conductors are exposed, for example, due to roofing failure or rodent bites near solar panels. For example, when a PV string, referred to herein as a group of solar PV panels connected in series to form a single electrical circuit, is connected to a system, it may generate a DC (direct current) signal with noise in high-frequency ranges. In the event of an arc fault, noise may be generated in the middle-band set of frequencies, lower than the typical high-frequency noise.

Thus, in order to detect an arc in PV circuitry, the current through the PV line is constantly monitored. When an arc happens, the system sees a broad-spectrum injection of noise within the current signal, this signal is amplified, filtered, and/or detected, and the system may go into a risk-addressed state.

Figure 1E:
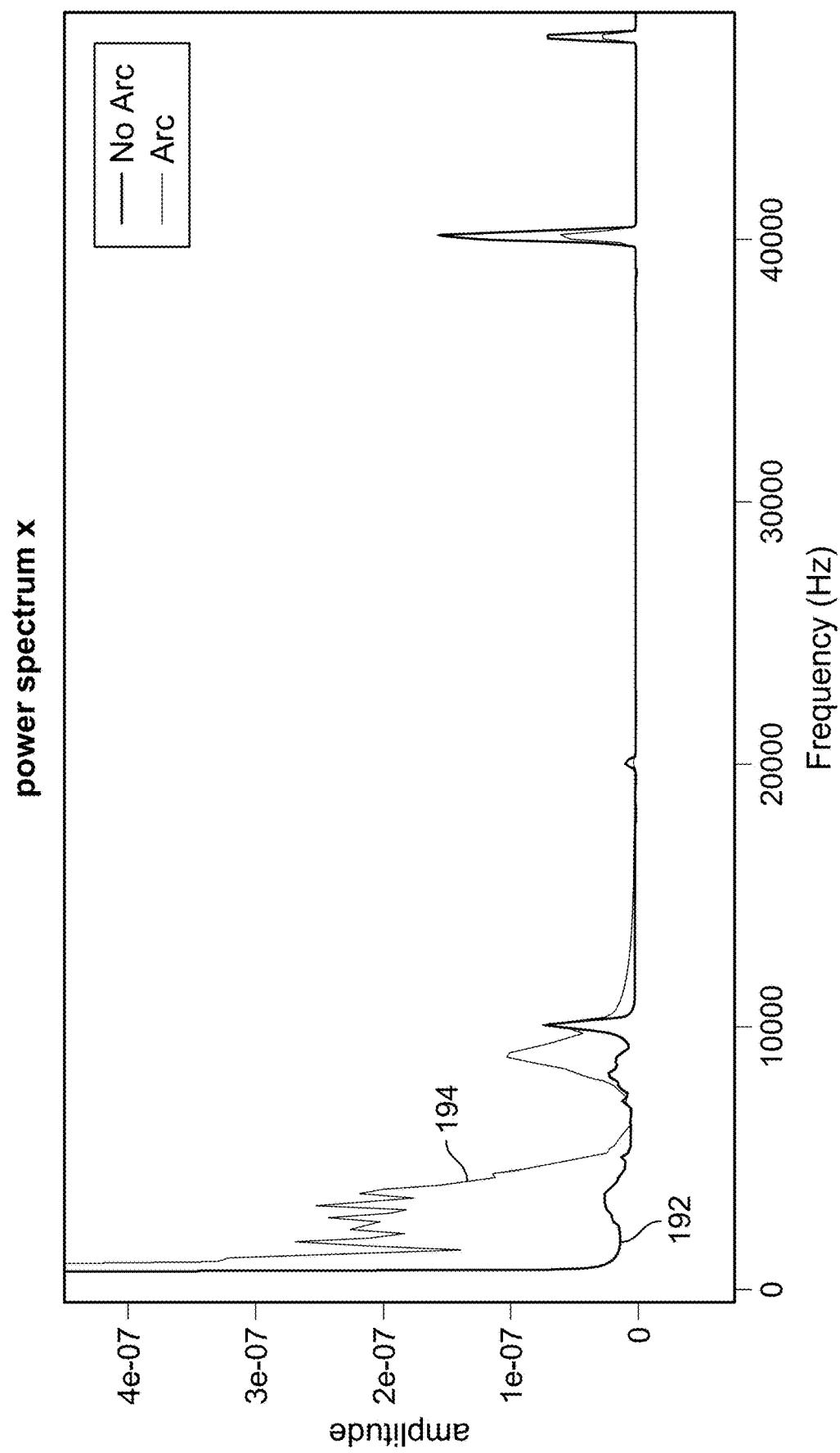
FIG. 1E is an example illustration of broad-spectrum injection of noise when an arc happens.

FIG. 1E is an example illustration of broad-spectrum injection of noise when an arc happens. As shown in FIG. 1E, a power spectrum of a nominal system (192) is relatively flat above 120 Hz which presents a ripple harmonic. This changes with a power spectrum of a system under arc fault (194) which has "signature" components between 1-3 kHz and between 6-9 kHz. In one embodiment, an "arc signature" is any waveform with a power spectrum within a threshold of similarity to FIG. 1E. In one embodiment, an "arc signature" is any waveform with a power spectrum that has signature components between 1-3 kHz and between 6-9 kHz. In one embodiment, an "arc signature" is any waveform with a power spectrum with components between 1 kHz and 250 kHz within a threshold of significant magnitude.

In addition to detecting an arc, a functional safety requirement may include being able to justify that the arc fault detector and/or interrupter are one fault tolerant, referred to herein as a system's ability to continue operating nominally when one of the system's components fails. That is, beyond detecting an arc fault, the requirement includes assuring the arc fault detection system is itself not faulty so that it can at least correctly detect an arc fault. Instead of an over-engineering of redundant components/circuitry to meet this requirement, an arc fault health check circuit, referred to herein as an AFCI self-test, is disclosed that ensures that the AFCI circuit works and one or more faults are not detected in the arc fault sensor.

Figure 2:
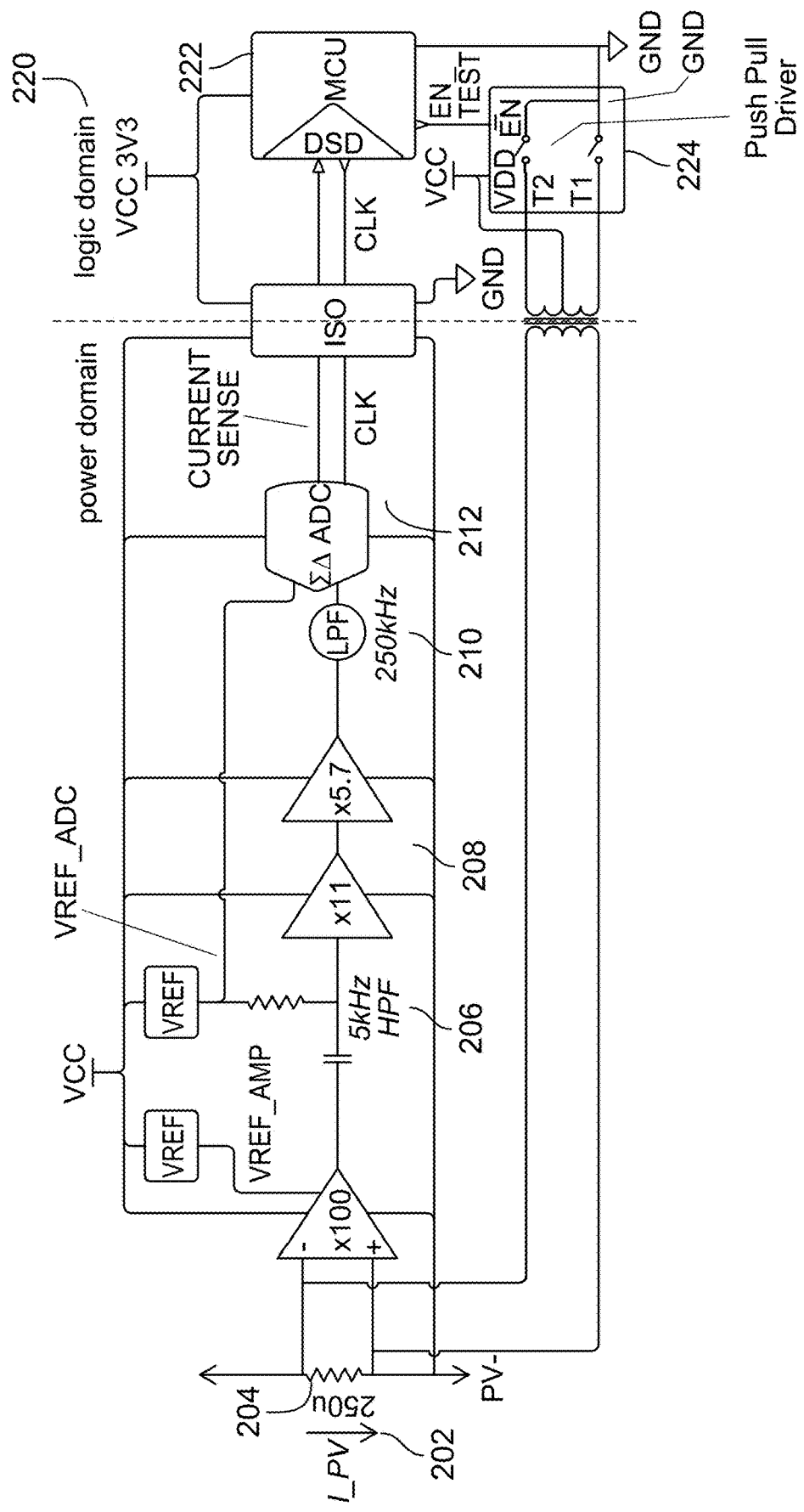
FIG. 2 is a block diagram illustrating an embodiment of an arc fault current detection and interruption circuit and an arc fault current health check circuit.

FIG. 2 is a block diagram illustrating an embodiment of an arc fault current detection and interruption circuit and an arc fault current health check circuit. In one embodiment, the circuit of FIG. 2 is part of the system depicted in FIG. 1D (186), (188), (190).

As shown in FIG. 2, the sensing circuit for AFCI is a modified version of the I_PV signal (202), the PV current from all PV strings, based on passing through a shunt resistor (204). In one embodiment, the modified signal runs through a high-pass filter (206) that removes unwanted lower frequency signals, for example the 120 Hz component of a switching frequency. In one embodiment, the high-pass filtered signal also runs through an amplification stage (208). In summary, the filter (206), (208) is designed to focus on mid-frequency, low-amplitude ripples within the PV current (202). In one embodiment, an anti-aliasing filter (210) is designed to prevent some of the switching harmonics from aliasing into measurement. In one embodiment, the filter (210) is a low-pass filter with a corner frequency of 250 kHz.

In one embodiment, for the sense circuit, the analog reading runs through an analog-to-digital converter front end (212). The arc fault current detection and interrupt circuit (202), (204), (206), (208), (210), and/or (212) is coupled with an arc fault current health check circuit (220), which includes a controller (222) and a chirp generator (224). In one embodiment, a Sigma-Delta Modulator acts as an external ADC. For example, certain controllers (222) such as XMC 4000 series chips (222) have an on-board Delta Sigma Demodulator (DSD), which may be used to decode the signal into usable ADC readings while providing advantages over using a built-in ADC on the controller (222), including higher bit resolution and built-in hardware decimation filtering.

Figure 3:
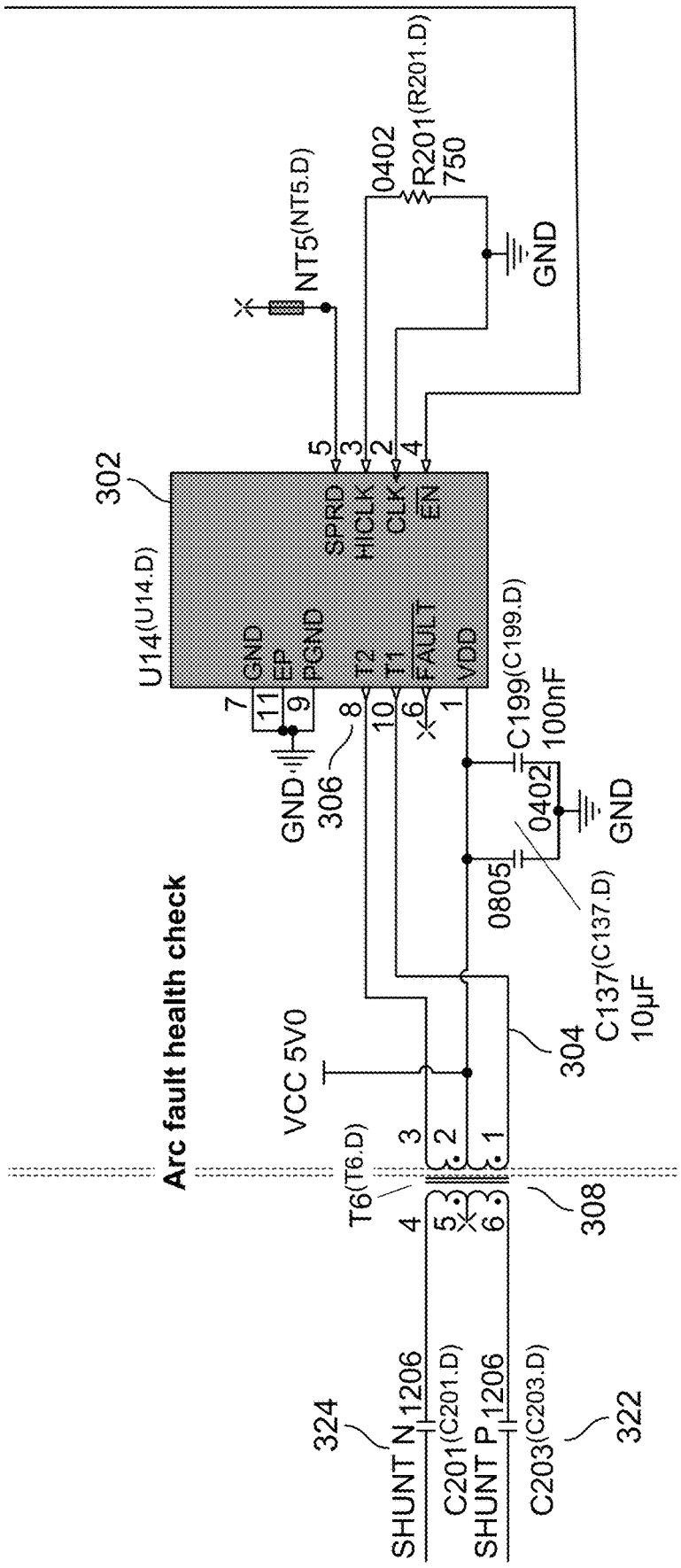
FIG. 3 is a circuit diagram illustrating an embodiment of an arc fault current health check circuit.

FIG. 3 is a circuit diagram illustrating an embodiment of an arc fault current health check circuit. In one embodiment, the circuit of FIG. 3 is part of the system depicted in FIG. 2 (220) and/or the system depicted in FIG. 1D (186), (188), (190).

An AFCI self-test in FIG. 3 is designed to ensure that the arc fault sensing circuit (202), (204), (206), (208), (210), and/or (212) in FIG. 2 is fully operational. The circuit of FIG. 3 is capable of detecting missing filter components, a broken PV current shunt, and/or broken/shorted op amps, for example. In order to be able to identify failed circuits, a signal is injected at the source and at the end of the circuit chain (202), (204), (206), (208), (210), and/or (212) the output is measured. If the output is within defined limits, it is concluded that the downstream circuits currently work.

In one embodiment, a chirp generator (302) is a push-pull transformer driver (302), shown in FIG. 3, and is coupled to a transformer wherein the secondary windings are connected across the current sense PV shunt resistor (204) in FIG. 2. Periodically, for example, every 24 hours, an AC current is applied across the shunt resistor (204) by the push-pull driver (302) across the transformer (308) and AC coupled via capacitors (322), (324), and the chirp signal is propagated through the sense chain. The controller (182) is primed to receive a specific waveform, and if this waveform is distorted, it concludes that the downstream circuitry is not operating as specified and throws an error/failure.

Figure 4A:
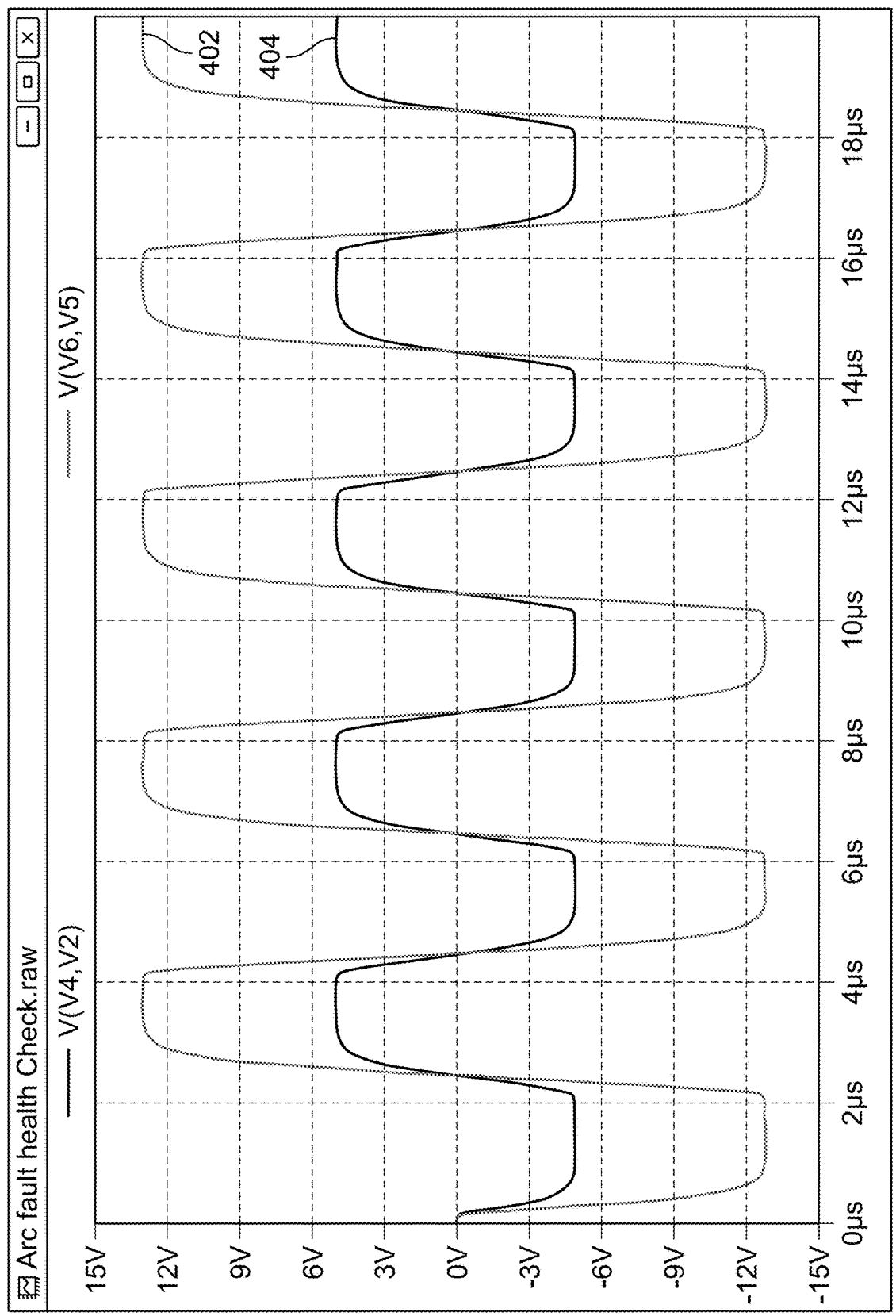
FIGS. 4A and 4B are illustrations of examples of a source signal and output signal for an AFCI self-test.
Figure 4B:
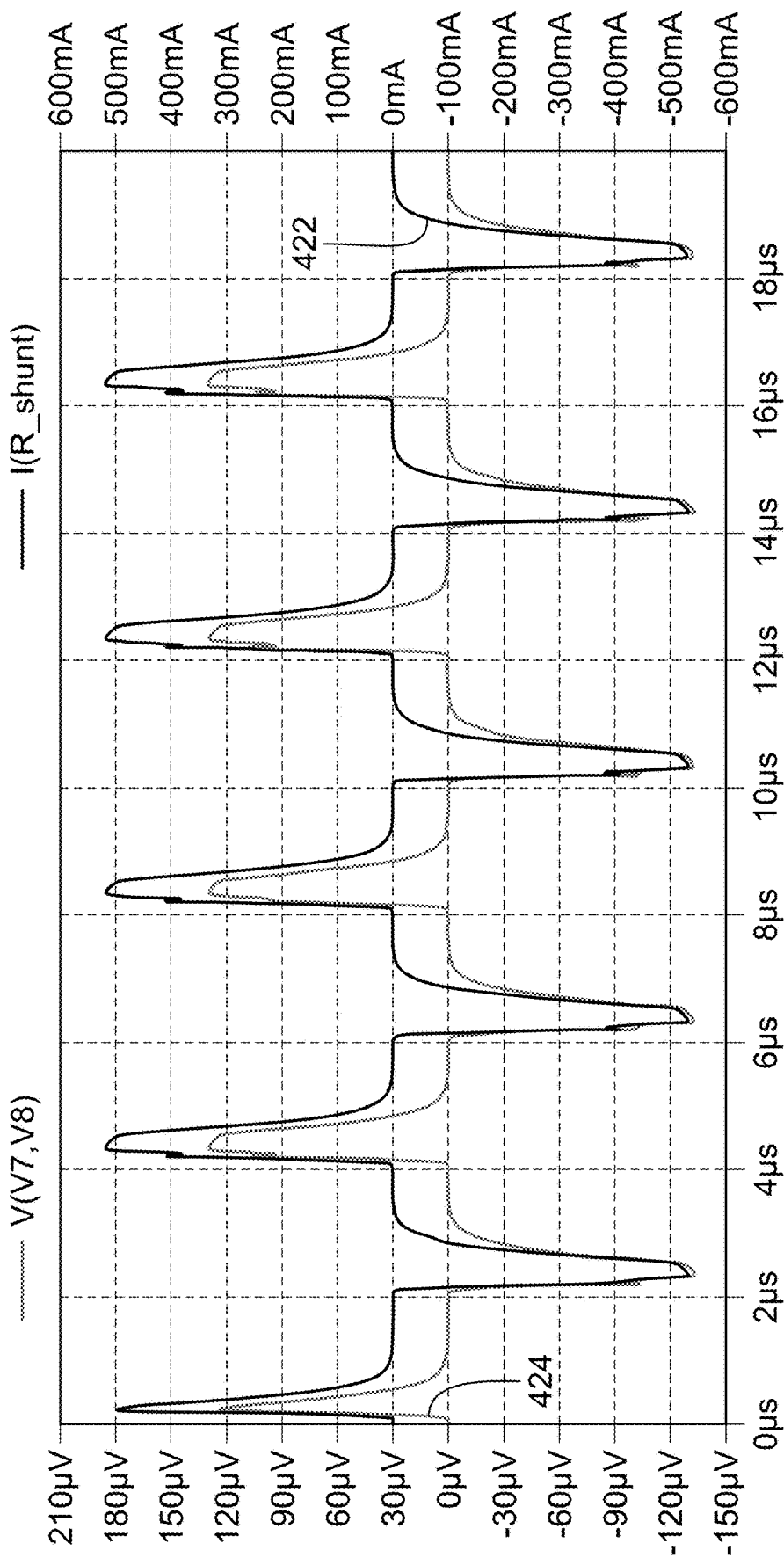

FIGS. 4A and 4B are illustrations of examples of a source signal and output signal for an AFCI self-test. The values of voltage, current, frequency, transformer details, resistance, and/or capacitance given below are for a specific application and without limitation, other values of voltage, current, and frequency may be used for other applications.

For FIG. 4A, when T1 (304) of FIG. 3 is closed being the "push" of the push-pull transformer driver (302), the voltage seen across the PV shunt (204) in FIG. 2 is +13V, as a +5V push from the push-pull transformer driver (302) is converted to +13V by the isolating 1.3:1 transformer (308) of FIG. 3. Similarly, when T2 (306) is closed being the "pull" of the push-pull transformer driver (302), the voltage seen across the shunt (204) is −13V. A 250 kHz AC wave may thus be generated using the push-pull transformer driver (302). This wave is shown in FIG. 4A, wherein the primary voltage is shown (404) as varying between +5V and −5V, and the secondary voltage (402) across the shunt (204) is shown as varying between +13V and −13V at 250 kHz.

For FIG. 4B, with two 22 nF capacitors (322), (324) in series with the shunt resistor (204), a filtered AC signal is inserted into the shunt (204) which creates a distinguishable, regular signal that may be used as a reference to confirm that the arc fault circuit works. If a deviation from this signal is detected, an error is flagged as a possible failure. This wave is shown in FIG. 4B, wherein the current (422) across the shunt (204) is shown with the ampere values shown along the right Y-axis of FIG. 4B, and the voltage (424) across the shunt (204) is shown with the voltage values shown along the left Y-axis of FIG. 4B.

In one embodiment, an FFT (fast Fourier transform) is computed in controller (222) to indicate whether the distinguishable, regular signal is similar to a "signature" or reference signal in terms of frequency/spectral elements. In one embodiment, simpler/less computing resources are used by counting the frequency and/or rate at which amplifiers, such as those shown in (208) in FIG. 2, hit a rail.

Figure 5:
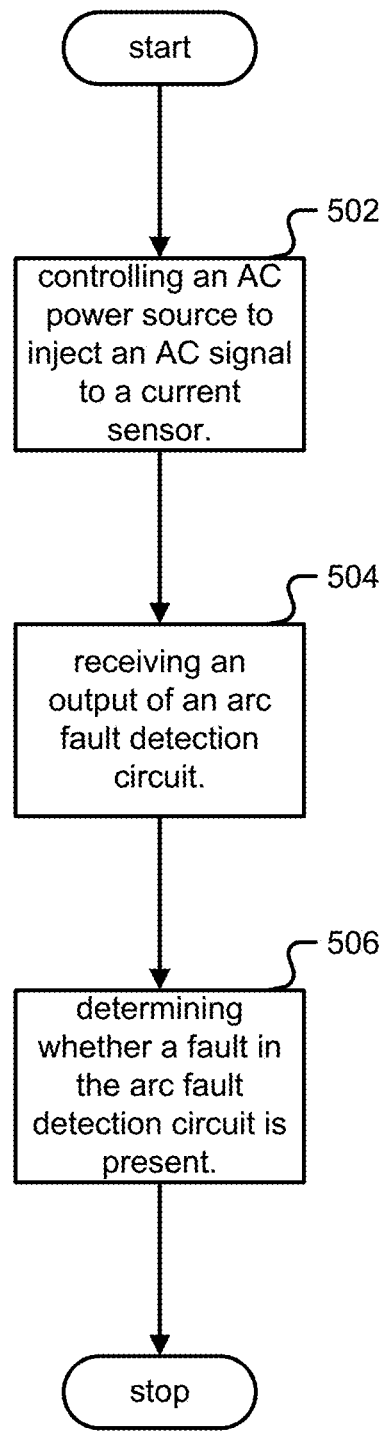
FIG. 5 is a flow diagram illustrating an embodiment of a process for one fault periodic circuit checking.

FIG. 5 is a flow diagram illustrating an embodiment of a process for one fault periodic circuit checking. In one embodiment, FIG. 5 shows a process for the circuit shown in FIG. 1C. In one embodiment, the process of FIG. 5 is carried out by a controller configured to check a health of an arc fault detection circuit coupled to a current sensor, wherein the arc fault detection circuit is configured to detect a presence of an arc based at least in part on the current sensor. In one embodiment, an AC (alternating current) power source is capacitively coupled to the current sensor.

In step (502), an AC power source is controlled to inject an AC signal to a current sensor. In one embodiment, the AC power source is capacitively coupled to the current sensor. In one embodiment, the current sensor comprises a shunt resistor. In one embodiment, the current sensor is coupled to one or more PV panels. In one embodiment, checking the health of the arc fault detection circuit further comprises causing disconnection of the current sensor to the one or more PV panels. In one embodiment, causing disconnection of the current sensor to the one or more PV panels comprises opening at least one relay between the current sensor and the one or more PV panels. In one embodiment, the injected AC signal comprises a chirp and/or simulated arc signature. In one embodiment, the AC power source comprises a push-pull transformer driver.

In step (504), an output of an arc fault detection circuit is received. In one embodiment, the arc fault detection circuit is coupled to the current sensor. In one embodiment, the arc fault detection circuit is configured to detect a presence of an arc based at least in part on the current sensor.

In one embodiment, based at least in part on detection of a presence of a fault in the arc fault detection circuit, the controller is configured to generate an error alert. In one embodiment, based at least in part on detection of a presence of a fault in the arc fault detection circuit, the controller is configured to cause the power system to enter a safe state.

In step (506), it is determined whether a fault in the arc fault detection circuit is present based at least in part on an evaluation of the output of the arc fault detection circuit. In one embodiment, the controller is configured to check the health of the arc fault detection circuit at least in part by entering a test mode. In one embodiment, the controller enters the test mode periodically. In one embodiment, the controller, when in a nominal operation mode, is configured to detect a presence of an arc based at least in part on an output of the arc fault detection circuit.

In one embodiment, the fault detection system further comprises an isolation circuit/component between the arc fault detection circuit and the microcontroller, wherein the isolation circuit is configured to transform a voltage of the output of the arc fault detection circuit.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A power system, comprising:
   a current sensor;
   an arc fault detection circuit coupled to the current sensor, wherein the arc fault detection circuit is configured to detect a presence of an arc based at least in part on the current sensor;
   an AC (alternating current) power source capacitively coupled to the current sensor;
   a controller configured to check a health of the arc fault detection circuit at least in part by:
     controlling the AC power source to inject an AC signal to the current sensor;
     receiving an output of the arc fault detection circuit; and
     determining whether a circuit fault in the arc fault detection circuit is present based at least in part on an evaluation of the output of the arc fault detection circuit; and
   wherein the arc fault detection circuit further comprises an isolation circuit between the arc fault detection circuit and the controller, wherein the isolation circuit is configured to transform a voltage of the output of the arc fault detection circuit.

2. The system of claim 1, wherein the current sensor comprises a shunt resistor.

3. The system of claim 1, wherein the current sensor is coupled to one or more PV (photovoltaic) panels.

4. The system of claim 3, wherein checking the health of the arc fault detection circuit further comprises causing disconnection of the current sensor to the one or more PV panels.

5. The system of claim 4, wherein causing the disconnection of the current sensor to the one or more PV panels comprises opening at least one relay between the current sensor and the one or more PV panels.

6. The system of claim 1, wherein the injected AC signal comprises a simulated arc signature.

7. The system of claim 1, wherein the AC power source comprises a push-pull transformer driver.

8. The system of claim 1, wherein based at least in part on detection of a presence of a fault in the arc fault detection circuit, the controller is configured to generate an error alert.

9. The system of claim 1, wherein based at least in part on detection of a presence of a fault in the arc fault detection circuit, the controller is configured to cause the power system to be shut down.

10. The system of claim 1, wherein the controller is configured to check the health of the arc fault detection circuit at least in part by entering a test mode.

11. The system of claim 10, wherein the controller enters the test mode periodically.

12. The system of claim 1, wherein the controller, when in a nominal operation mode, is configured to detect a presence of an arc based at least in part on the output of the arc fault detection circuit.

13. A method, comprising:
controlling an AC power source to inject an AC signal to a current sensor;
wherein the AC power source is capacitively coupled to the current sensor;
receiving an output of an arc fault detection circuit;
wherein the arc fault detection circuit is coupled to the current sensor, and wherein the arc fault detection circuit is configured to detect a presence of an arc based at least in part on the current sensor;
determining whether a fault in the arc fault detection circuit is present based at least in part on an evaluation of the output of the arc fault detection circuit; and
wherein the arc fault detection circuit further comprises an isolation circuit between the arc fault detection circuit and a controller, wherein the isolation circuit is configured to transform a voltage of the output of the arc fault detection circuit and wherein the controller is configured to check a health of the arc fault detection circuit.

14. The method of claim 13, wherein the current sensor comprises a shunt resistor.

15. The method of claim 13, wherein the current sensor is coupled to one or more PV panels.

16. The method of claim 13, wherein a controller is configured to check a health of the arc fault detection circuit at least in part by entering a test mode.

17. A computer program product embodied in a non-transitory computer readable medium and comprising computer instructions for:
controlling an AC power source to inject an AC signal to a current sensor;
wherein the AC power source is capacitively coupled to the current sensor;
receiving an output of an arc fault detection circuit;
wherein the arc fault detection circuit is coupled to the current sensor, and wherein the arc fault detection circuit is configured to detect a presence of an arc based at least in part on the current sensor;
determining whether a fault in the arc fault detection circuit is present based at least in part on an evaluation of the output of the arc fault detection circuit; and
wherein the arc fault detection circuit further comprises an isolation circuit between the arc fault detection circuit and a controller, wherein the isolation circuit is configured to transform a voltage of the output of the arc fault detection circuit and wherein the controller is configured to check a health of the arc fault detection circuit.

18. The computer program product of claim 17, wherein the current sensor is coupled to one or more PV panels.

19. The computer program product of claim 17, wherein a controller is configured to check a health of the arc fault detection circuit at least in part by entering a test mode.

* * * * *